US006531726B1

(12) United States Patent
Takamatsu

(10) Patent No.: US 6,531,726 B1
(45) Date of Patent: Mar. 11, 2003

(54) FERROELECTRIC CAPACITOR WITH ELECTRODE FORMED IN SEPARATE OXIDIZING CONDITIONS

(75) Inventor: Tomohiro Takamatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/694,303

(22) Filed: Oct. 24, 2000

(30) Foreign Application Priority Data

Oct. 26, 1999 (JP) .......................................... 11-304628

(51) Int. Cl.[7] .............................................. H01L 29/76
(52) U.S. Cl. ............................. 257/295; 257/288; 438/3
(58) Field of Search ................................. 257/295, 288; 438/3

(56) References Cited

U.S. PATENT DOCUMENTS 6,326,218 B1 * 12/2001 Yunogami et al. ............. 438/3

6,355,492 B1 * 3/2002 Tanaka et al. .................. 438/3

OTHER PUBLICATIONS

IDS Reference AK: Journal of Applied Physics, 1999 American Institute of Physics, V. 85, No. 2, Jan. 15, 1999.*

Journal of Applied Physics, 1999 American Institute of Physics, vol. 85, No. 2, Jan. 15, 1999.

* cited by examiner

*Primary Examiner*—Nathan J. Flynn
*Assistant Examiner*—Scott R. Wilson
(74) *Attorney, Agent, or Firm*—Armstrong Westerman & Hattori, LLP

(57) ABSTRACT

A method of fabricating a ferroelectric capacitor comprises the steps of forming an upper electrode on a ferroelectric film formed on a lower electrode by a sputtering process of a conductive oxide film, wherein the sputtering process is conducted by using a metal target under a first, oxidizing condition and a second, less oxidizing condition.

10 Claims, 20 Drawing Sheets

FREE
SURFACE
←

IrO2

Si

FERROELECTRIC CAPACITOR WITH ELECTRODE FORMED IN SEPARATE OXIDIZING CONDITIONS

CROSS-REFERENCE TO RELATED APPLICATION

The present application is based on Japanese priority application No.11-304628 filed on Oct. 26, 1999, the entire contents of which are hereby incorporated by reference.

BACKGROUND OF THE INVENTION

The present invention generally relates to semiconductor devices and more particularly to a ferroelectric capacitor, a semiconductor device having such a ferroelectric capacitor, and a fabrication process thereof.

Conventionally, EPROMs and flash memory devices are used extensively as a non-volatile semiconductor memory device that retains information even when electric power is turned off. These EPROMs and flash memory devices have a floating gate electrode and a tunneling insulation film cooperating therewith for retaining information. Particularly, a flash memory device has a simple construction in that only a single memory cell transistor is included in a single memory cell similarly to the case of a DRAM, and is thus suitable for constructing a large-scale integrated circuit.

In a flash memory device, in which writing or erasing of information is achieved by way of hot-electron injection or removal to and from the floating gate electrode via the tunneling insulation film, it is necessary to use a high voltage at the time of writing or erasing operation. Thus, it is inevitable that a large electric field is applied to the tunneling insulation film, while such a large electric field induces deterioration of the tunneling insulation film and limits the lifetime of the flash memory device. Further, in view of the fact that writing of information is achieved by way of injection of hot electrons, it takes a considerable time for writing information in flash memory devices. While a flash memory device is capable of storing multi-value information by controlling the amount of the electric charges injected into the floating gate electrode, such a possibility of multi-value storage of information also indicates the necessity of careful control of the electric charge injection by taking into account the degree of deterioration of the tunneling insulation film. Otherwise, erroneous operation will be caused.

A ferroelectric random access memory device is a semiconductor memory device having a ferroelectric capacitor that uses a ferroelectric film as the capacitor insulation film and stores information in the ferroelectric film in the form of spontaneous polarization of the ferroelectric film. In a ferroelectric random access memory device, writing or erasing of information is achieved by inverting the direction of the foregoing spontaneous polarization of the ferroelectric capacitor insulation film. Such an inversion of the polarization is achieved only by way of application of electric voltage and injection of electric current is not necessary. Thus, a ferroelectric random access memory device provides the advantageous features of very fast speed of writing operation and small power consumption. Further, in view of the fact that the polarization of the ferroelectric capacitor is limited either to a positive direction or a negative direction, there arises no problem of excessive erasing as in the case of a flash memory device.

FIG. 1 shows the construction of a conventional memory cell of a conventional ferroelectric random access memory device.

Referring to FIG. 1, the memory cell has a so called 2T/2C construction that uses two transfer gate transistors $T_1$ and $T_2$ and two ferroelectric capacitors $C_1$ and $C_2$ for storing one-bit information. In the construction of FIG. 1, the memory cell achieves a complementary operation in which information "1" is stored in one of the capacitors and information "0" is stored in the other capacitor.

In more detail, the transfer gate transistors $T_1$ and $T_2$ are turned on by selecting a word line WL, and the information "1" or "0" is written into the capacitor $C_1$ from a bit line BIT connected to the transistor $T_1$. Simultaneously, the complementary information "0" or "1" is written into the capacitor $C_2$ from a complementary bit line /BIT. Thereby, the ferroelectric capacitor insulation films of the capacitors $C_1$ and $C_2$ store the written information in the form of spontaneous polarization.

In the reading mode operation of the memory cell, the word line WL is selected again and the transistors $T_1$ and $T_2$ are turned on. Further, the voltage difference appearing across the bit lines BIT and /BIT as a result of the respective polarizations of the ferroelectric capacitors $C_1$ and $C_2$ is detected by a sense amplifier S/A.

Generally, a ferroelectric material having a perovskite crystal structure such as PZT having a composition (Pb,Zr)$TiO_3$ or PLZT having a composition (Pb, Zr) (Ti,La)$O_3$ is used for the ferroelectric capacitor insulation film in the capacitors $C_1$ and $C_2$. Alternatively, a Bi compound having a layered structure such as $SrBi_2Ta_2O_9$ designated as SBT or a compound represented as $SrBi_2(Ta,Nb)_2O_9$ designated as SBTN may be used for the ferroelectric capacitor insulation film.

When forming such a ferroelectric capacitor, it is generally practiced to deposit the ferroelectric film by a sol-gel process or sputtering process in the form of amorphous phase. The amorphous film thus formed is then subjected to a crystallization process by applying a high-temperature annealing process for a very short time. Without crystallization, the film does not provide the desired ferroelectric polarization.

In such a crystallizing process, there is a tendency that the PZT or PLZT film undergoes oxygen defect formation. Thus, in order to avoid the oxygen defect formation and to avoid deterioration of the ferroelectric property, it is practiced to carry out the crystallization process in an oxidizing atmosphere. Thereby, in order to avoid the unwanted problem of oxidation of the lower electrode of the ferroelectric capacitor, there is a proposal to carry out the crystallization process first in an inert atmosphere and then in an oxidizing atmosphere.

After the foregoing crystallization and oxygen compensation process, the upper electrode of the ferroelectric capacitor is formed on the ferroelectric film thus processed. Conventionally, such a formation of the upper electrode has been achieved by sputtering a refractory metal film such as a Pt film or an Ir film. As the sputtering process of the Pt film or Ir film is conducted in a non-oxidizing atmosphere, there has been a problem that the oxygen defects are formed again in the ferroelectric film with the deposition of the upper electrode.

In relation to the problem of oxygen-defect formation at the time of deposition of the upper electrode, there has been a proposal to use a conductive oxide film such as an $IrO_2$ film for the upper electrode of the ferroelectric capacitor. By using such a conductive oxide film for the upper electrode, the problem of oxygen-defect formation in the ferroelectric capacitor insulation film at the time of deposition of the upper electrode is successfully avoided by conducting the deposition of the upper electrode in an oxidizing atmosphere, and the problem of increase of the resistance of the upper electrode caused by the oxidation is also avoided as a result of use of oxide for the electrode.

Meanwhile, it has been known that the process of forming an $IrO_2$ electrode film tends to induce the problem of abnormal growth of the $IrO_2$ crystals leading to the formation of giant $IrO_2$ crystals. Such giant $IrO_2$ crystals act as defect in the $IrO_2$ electrode and cause a decrease of yield of production of the semiconductor device. Further, electric properties of the ferroelectric capacitor are deteriorated by the existence of such giant $IrO_2$ crystals.

SUMMARY OF THE INVENTION

Accordingly, it is a general object of the present invention to provide a novel and useful ferroelectric capacitor and a semiconductor device having such a ferroelectric capacitor wherein the foregoing problems are eliminated.

Another and more specific object of the present invention is to provide a ferroelectric capacitor having an upper electrode formed of a conductive oxide wherein the amount of switching electric charges of a ferroelectric film constituting the capacitor insulation film of the ferroelectric capacitor is increased.

Another object of the present invention is to provide a semiconductor device having a ferroelectric capacitor in which the amount of switching electric charges is increased.

Another object of the present invention is to provide a fabrication process of a semiconductor device having a ferroelectric capacitor wherein abnormal growth of $IrO_2$ crystals in an $IrO_2$ upper electrode is successfully suppressed.

Another object of the present invention is to provide a method of fabricating a ferroelectric capacitor, comprising the steps of:

forming a lower electrode;

forming a ferroelectric film on said lower electrode; and forming an upper electrode on said ferroelectric film, said step of forming said upper electrode comprising a first reactive sputtering process of a conductive oxide film and a second reactive sputtering process of said conductive oxide film conducted after said first reactive sputtering process, said first and second reactive sputtering process being conducted by using a target of a metal element constituting said conductive oxide film, said first reactive sputtering process being conducted under a first, oxidizing condition such that oxidation of said metal element takes place, said second reactive sputtering process being conducted under a second, less oxidizing condition.

Another object of the present invention is to provide a ferroelectric capacitor, comprising:

a substrate, an active device formed on said substrate, an interlayer insulation film provided on said substrate so as to cover said active device; and a ferroelectric capacitor provided on said interlayer insulation film in electrical connection with said active device, said ferroelectric capacitor comprising: a lower electrode formed on said interlayer insulation film, a ferroelectric film containing Pb formed on said lower electrode; and an upper electrode formed on said ferroelectric film, said upper electrode comprising a conductive oxide film deposited on said ferroelectric film, said conductive oxide film containing Pb with a generally uniform concentration in a thickness direction thereof, said conductive oxide film comprising a lower part and an upper part, said upper part containing more proportion of said metal in a metallic state as compared with said lower part.

According to the present invention, the problem of oxygen defect formation in the ferroelectric film at the time of formation of the upper electrode is successfully eliminated by forming the upper electrode by conducting a sputtering process of a conductive oxide film under an oxidizing condition. By reducing the thickness of the conductive oxide film thus formed, the abnormal growth of giant crystals in the conductive oxide film is suppressed, and the yield of production of the semiconductor device is improved substantially. Further, it becomes possible to deposit the conductive oxide film with an increased deposition rate without deteriorating the electric properties of the ferroelectric film, by depositing the conductive oxide film first with a strong oxidizing condition, followed by a less strong oxidizing condition. The conductive oxide film thus formed by such a two-step process that uses the strong oxidizing condition and less strong oxidizing condition contains Pb that constitutes the ferroelectric film, with a generally uniform concentration level in the thickness direction of the conductive oxide film.

Other objects and further features of the present invention will become apparent from the following detailed description when read in conjunction with the attached drawings.

DETAILED DESCRIPTION OF THE INVENTION

[First Embodiment]

Figure 1:
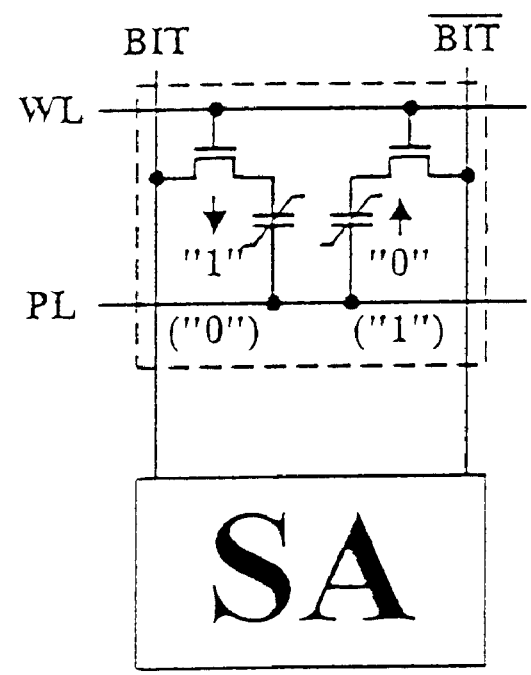
FIG. 1 is a circuit diagram showing the construction of a conventional ferroelectric random access memory device.
Figure 2:
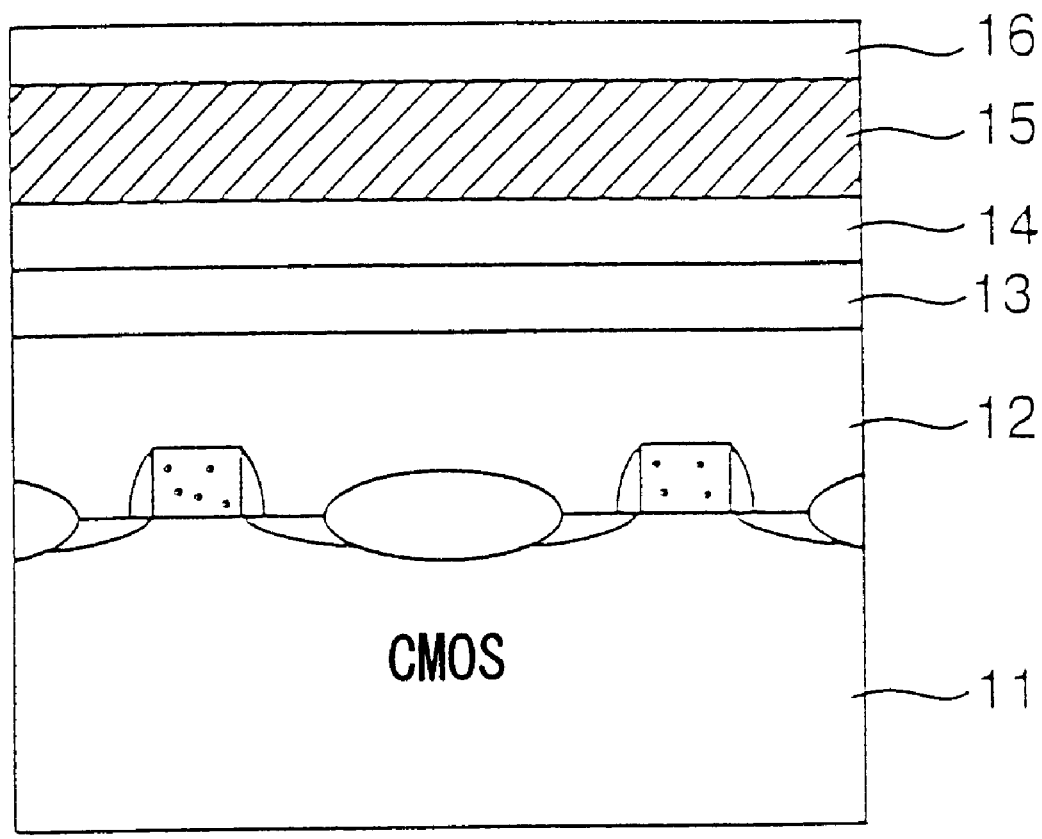
FIG. 2 is a cross-sectional diagram showing the construction of a ferroelectric capacitor according to a first embodiment of the present invention.

FIG. 2 shows the construction of a ferroelectric capacitor according to a first embodiment of the present invention.

Referring to FIG. 2, a Si substrate 11 carries thereon a CMOS structure, and a CVD oxide film 12 is formed on the Si substrate 11 so as to bury the CMOS structure underneath. On the CVD oxide film 12, a Ti adhesion layer 13 is deposited by a sputtering process with a thickness of about 20 nm, and a lower electrode 14 of Pt is formed on the Ti adhesion layer 13 also by a sputtering process with a thickness of about 175 nm. TABLE I below summarizes the sputtering condition of the Ti adhesion layer 13 and the lower electrode 14.

TABLE I

|    | Ar pressure | D.C. power | time   |
|----|-------------|------------|--------|
| Ti | 0.7 Pa      | 2.6 kW     | 9 sec  |
| Pt | 0.7 Pa      | 1.0 kW     | 96 sec |

It should be noted that the lower electrode 14 is by no means limited to Pt but may be formed of Ir or Ru or a conductive oxide thereof such as RuO$_2$ or SrRuO$_3$.

On the lower electrode 14, a ferroelectric capacitor insulation film 15 of PZT or PLZT is formed by an R.F. sputtering process with a thickness of about 200 nm under a condition summarized in TABLE II below.

TABLE II

|              | Ar pressure | R.F. power | time    |
|--------------|-------------|------------|---------|
| PLZT (200 nm)| 1.1 Pa      | 1.0 kW     | 434 sec |

The capacitor insulation film 15 thus formed is then subjected to a crystallization process by applying a rapid thermal annealing (RTA) process at 600° C. for a 60 seconds in an Ar atmosphere containing O$_2$ with a concentration less than about 5%, followed by an oxygen compensating process conducted at 750° C. for 60 seconds for compensation of any oxygen defects.

After the formation of the ferroelectric capacitor insulation film 15, an upper electrode 16 of IrO$_2$ is formed on the capacitor insulation film 15 under the condition summarized in TABLE III below.

TABLE III

| IrO$_2$ (single step process) | |
|---|---|
| pressure | 0.8 Pa |
| oxygen flow-rate | 100 sccm |

TABLE III-continued

| IrO$_2$ (single step process) | |
|---|---|
| Ar flow-rate | 100 sccm |
| power and time | 1 kW, 79 seconds |
| substrate temperature | room temperature |
| thickness | 200 nm |

Figure 3:
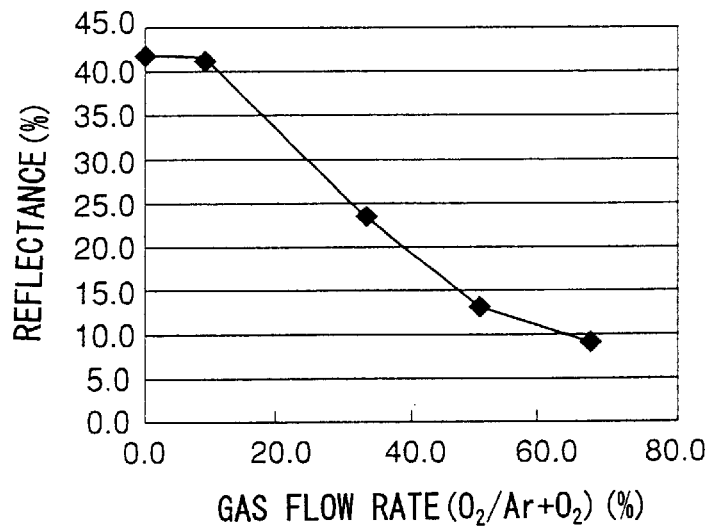
FIG. 3 is a diagram showing the relationship between the reflectance of an $IrO_2$ film formed by a reactive sputtering process and a gas flow-rate in relation to the first embodiment of the present invention.

Hereinafter, a preliminary explanation of the present embodiment will be given with reference to FIGS. 3 and 4, wherein FIG. 3 shows the optical reflectance of the IrO$_2$ electrode layer 16 thus formed under the condition of TABLE 3 while changing the oxygen flow-rate and the Ar flow-rate variously.

Referring to FIG. 3, it can be seen that the reflectance of the IrO$_2$ electrode layer 16 decreases with increased proportion of oxygen in the sputtering atmosphere, indicating that the proportion of IrO$_2$ in the layer 16 increases as a result of progress of oxidation of Ir. In other words, the relationship of FIG. 3 indicates that the reflectance of the IrO$_2$ electrode layer 16 can be used as the index of degree of oxidation of the IrO$_2$ electrode layer 16.

Figure 4:
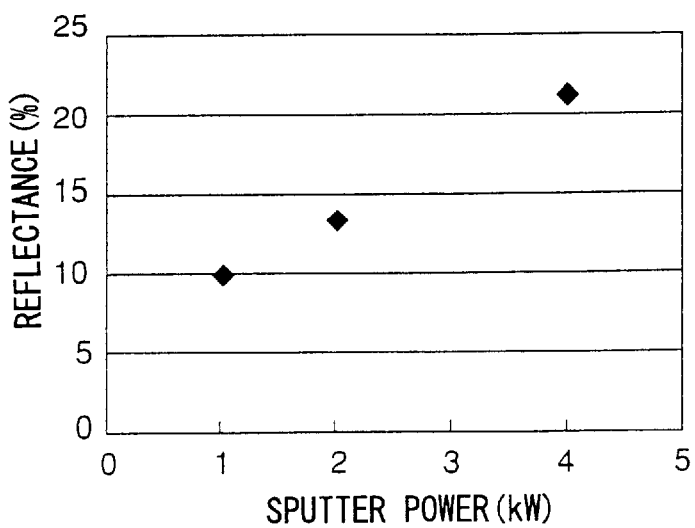
FIG. 4 is a diagram showing the relationship between the reflectance of an $IrO_2$ film formed by a reactive sputtering process and a sputtering power in relation to the first embodiment of the present invention.

FIG. 4, on the other hand, shows the optical reflectance of the IrO$_2$ electrode layer 16 for the case in which the sputtering power is changed variously while maintaining the same sputtering atmosphere.

Referring to FIG. 4, it can be seen that the optical reflectance increases with increasing sputtering power, indicating that there occurs a reduction in the electrode layer 16 when the sputtering power is increased and that the electrode layer 16 is primarily formed of metal Ir. When the sputtering power is set low, on the other hand, there occurs an oxidation in the IrO$_2$ electrode layer 16 during the sputtering process thereof.

The result of FIGS. 3 and 4 indicates clearly that it is preferable to use a low sputter power and associated oxidizing atmosphere when forming the upper electrode 16 by IrO$_2$.

Figure 5:
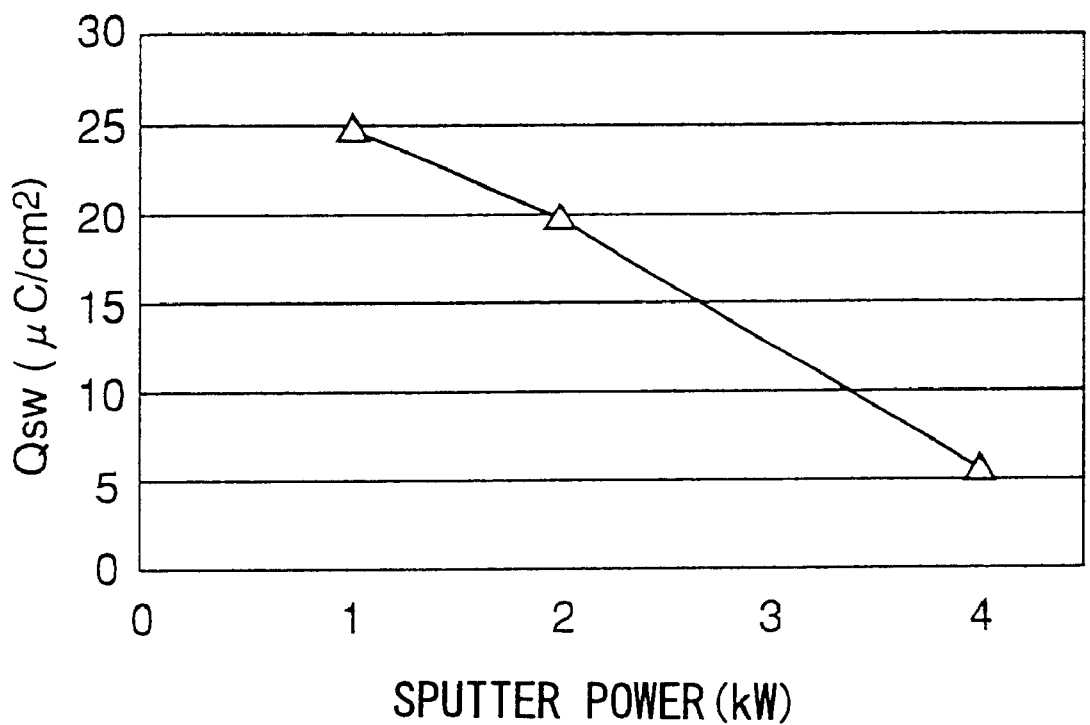
FIG. 5 is a diagram showing the relationship between the switching electric charge of the ferroelectric capacitor of FIG. 2 and a sputtering power.

FIG. 5 shows the relationship between the switching electric charge Q$_{SW}$ of the ferroelectric capacitor thus formed and the sputtering power used for forming the IrO$_2$ upper electrode 16.

Referring to FIG. 5, it can be seen that a large switching electric charge Q$_{SW}$ is obtained for the ferroelectric film 15 underneath the electrode layer 16 when the sputtering power used for forming the IrO$_2$ electrode layer 16 is set low. This phenomenon indicates that the sputtering atmosphere has changed to become more oxidizing as a result of the use of the low sputtering power and the oxidizing atmosphere thus realized has suppressed the reduction of the ferroelectric film 15.

Figure 6:
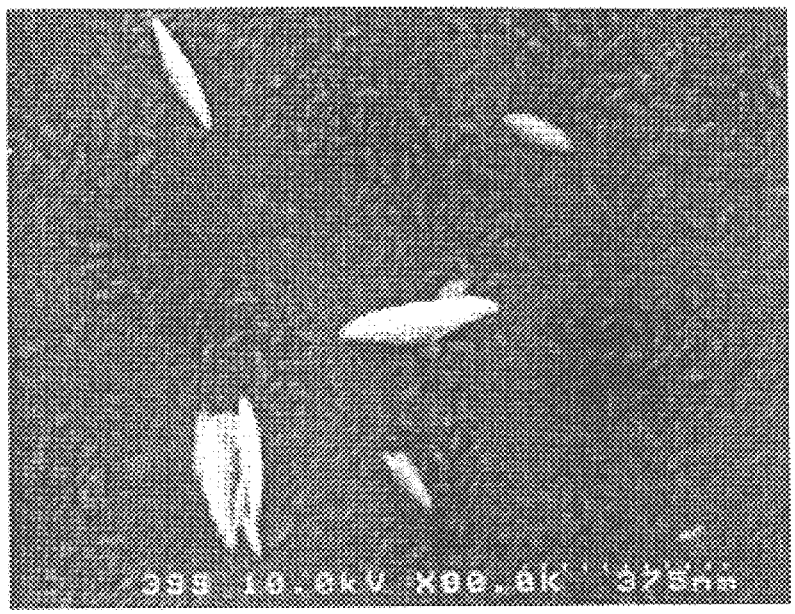
FIG. 6 is a diagram showing an example of defects formed in an $IrO_2$ film deposited according to a conventional process.

FIG. 6 shows the surface state of the electrode layer 16 observed by electron microscopy for the case in which the electrode layer 16 is sputtered consecutively on a number of substrates while setting the sputtering power to 1 kW in accordance with the condition of TABLE III. In FIG. 6, the electrode layer 16 is formed with a thickness of 200 nm.

According to the experiment, the substrate temperature increases gradually with the progress of the sputter deposition on the substrates, and because of the gradual rise of the substrate temperature, it was observed that giant IrO$_2$ crystals having a needle shape as represented in FIG. 6 start to appear after the 25th deposition, wherein FIG. 6 shows the case in which the sputter deposition was conducted with the sputtering power of 1 kW such that the IrO$_2$ electrode layer 16 has the thickness of 200 nm.

Figure 7A:
FIGS. 7A and 7B are diagrams showing further examples of the defects formed in an $IrO_2$ film deposited according to a conventional process.
Figure 7B:
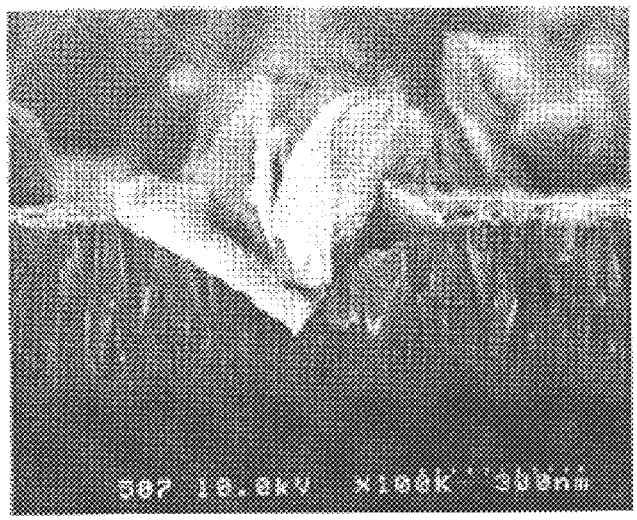

FIGS. 7A and 7B show the surface state of the electrode layer 16 for the case in which the $IrO_2$ electrode layer 16 is formed with a thickness of 300 nm while setting the sputtering power to 1 kW.

Referring to FIG. 7A, it can be seen that giant $IrO_2$ crystals are formed on the electrode layer 16 after the 25th substrate similarly to the case of FIG. 6, except that the degree of the abnormal crystal growth proceeds further to such a degree that development of crystal surfaces is recognized. As represented in FIG. 7B, such giant $IrO_2$ crystals act as defects on the surface of the electrode layer 16. From FIG. 7B, it can be seen that the giant $IrO_2$ crystal appears at the intermediate thickness of the $IrO_2$ film, suggesting that the abnormal growth of the $IrO_2$ crystal starts when the substrate temperature has reached a certain temperature as a result of continuation of the sputter deposition process of the $IrO_2$ film for some time.

Figure 8:
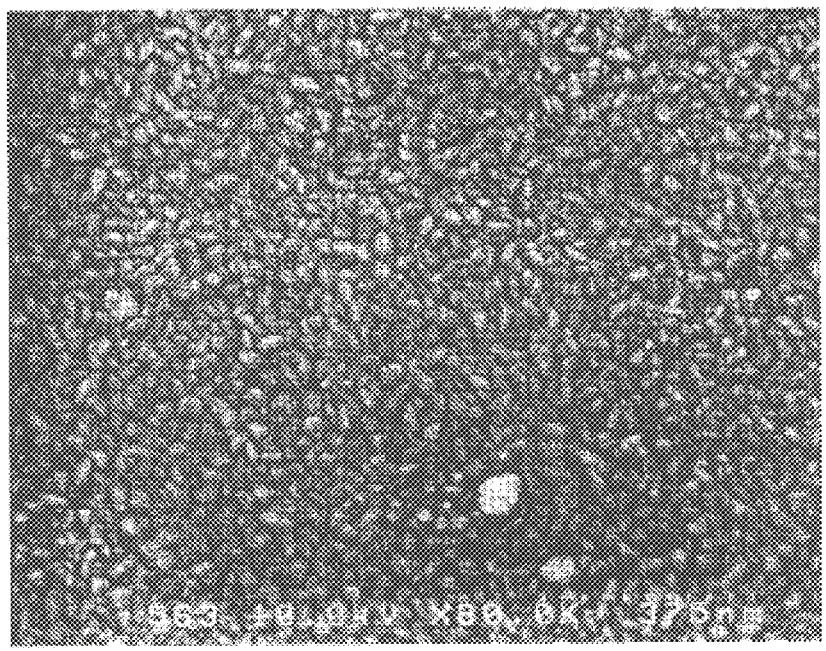
FIG. 8 is a diagram showing the surface state of an $IrO_2$ film formed according to the process of the present invention.

FIG. 8 shows the surface state of the $IrO_2$ electrode layer 16 for the case in which the electrode layer 16 is formed by depositing an $IrO_2$ film by a two-step process, first with a thickness of 100 nm while setting the sputtering power to 1 kW, and next for another 100 nm while increasing the sputtering power to 2 kW.

Referring to FIG. 8, the electrode layer 16 has a surface in which fine $IrO_2$ crystals, represented in FIG. 8 by white dots, are scattered uniformly, and the existence of giant crystals as explained with reference to FIGS. 7A and 7B is not recognized. In other words, formation of defects in the upper electrode layer 16 is avoided when the deposition process includes an initial process in which the electrode layer 16 is formed within the thickness of 100 nm while setting the sputtering power to be 1 kW or less. As long as the initial sputtering process is conducted with such a low sputtering power, formation of defects in the electrode layer 16 does not occur even when the deposition of the $IrO_2$ layer is continued thereon with a different sputtering condition. It should be noted that FIG. 8 shows the surface state of the substrate on which the 100th deposition has been made for the case in which 100 continuous deposition of the $IrO_2$ electrode layer 16 has been made on 100 substrates.

Generally, the formation of the giant crystals as represented in FIG. 6 or FIGS. 7A and 7B can be suppressed when the formation of the $IrO_2$ electrode layer 16 is conducted such that the $IrO_2$ electrode layer 16 has a thickness of 100 nm or less. In the experiments conducted by the inventor of the present invention, for example, no defect formation was observed in the 29th or later deposition experiments when the $IrO_2$ electrode layer 16 was formed with the thickness of 100 nm. When the $IrO_2$ electrode layer 16 was formed with the thickness of 50 nm, no defect formation was observed in the 30th or later deposition experiments. Further, the use of the low sputtering power is effective for avoiding the reduction of the underlying ferroelectric film 15 and for realizing excellent electric property for the ferroelectric capacitor. In the example of FIG. 8, it should be noted that the $IrO_2$ crystals have an average grain size of only 10–30 nm, while in the case of FIGS. 7A and 7B, the $IrO_2$ crystals have an average grain size of 300–400 nm.

Figure 9:
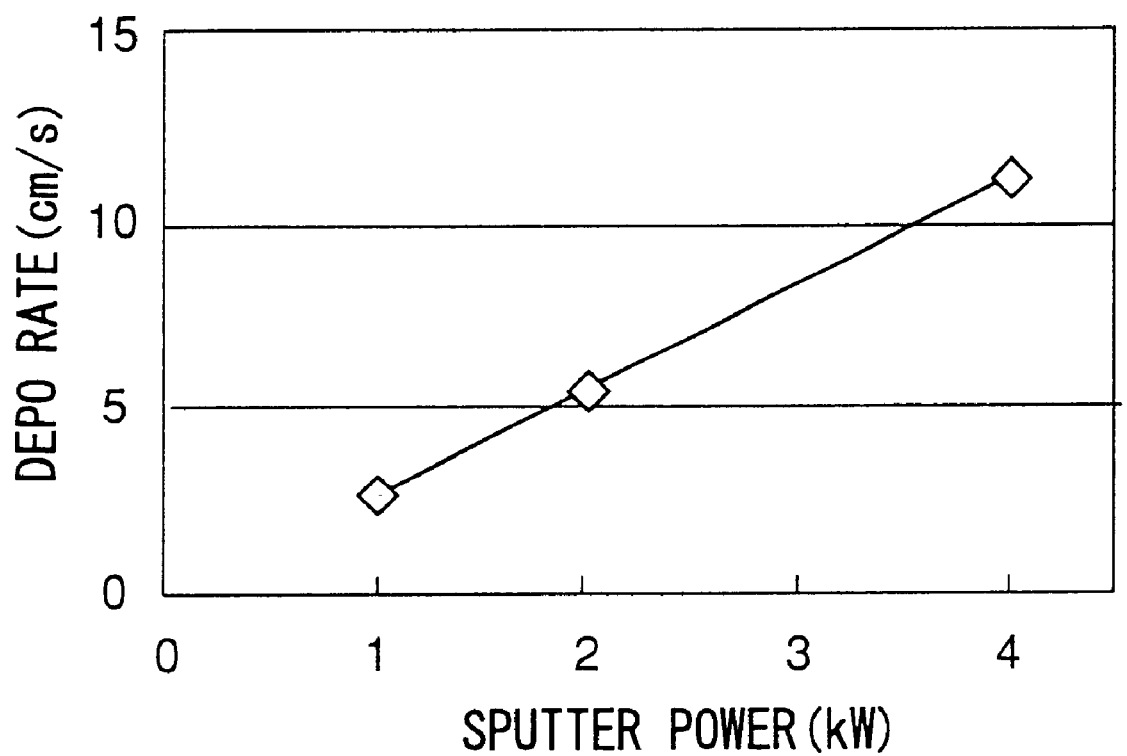
FIG. 9 is a diagram showing the relationship between the deposition rate of the $IrO_2$ film formed according to the process of the present invention and a sputtering power.

On the other hand, such a decrease of the sputtering power inevitably causes a decrease in the growth rate of the electrode layer 16 as represented in FIG. 9, wherein it should be noted that FIG. 9 represents the relationship between the growth rate of the $IrO_2$ electrode layer 16 and the sputtering power. From FIG. 9, it can be seen that a growth rate of only 2–3 nm/sec is obtained when the sputtering power of 1 kW is used.

Figure 10:
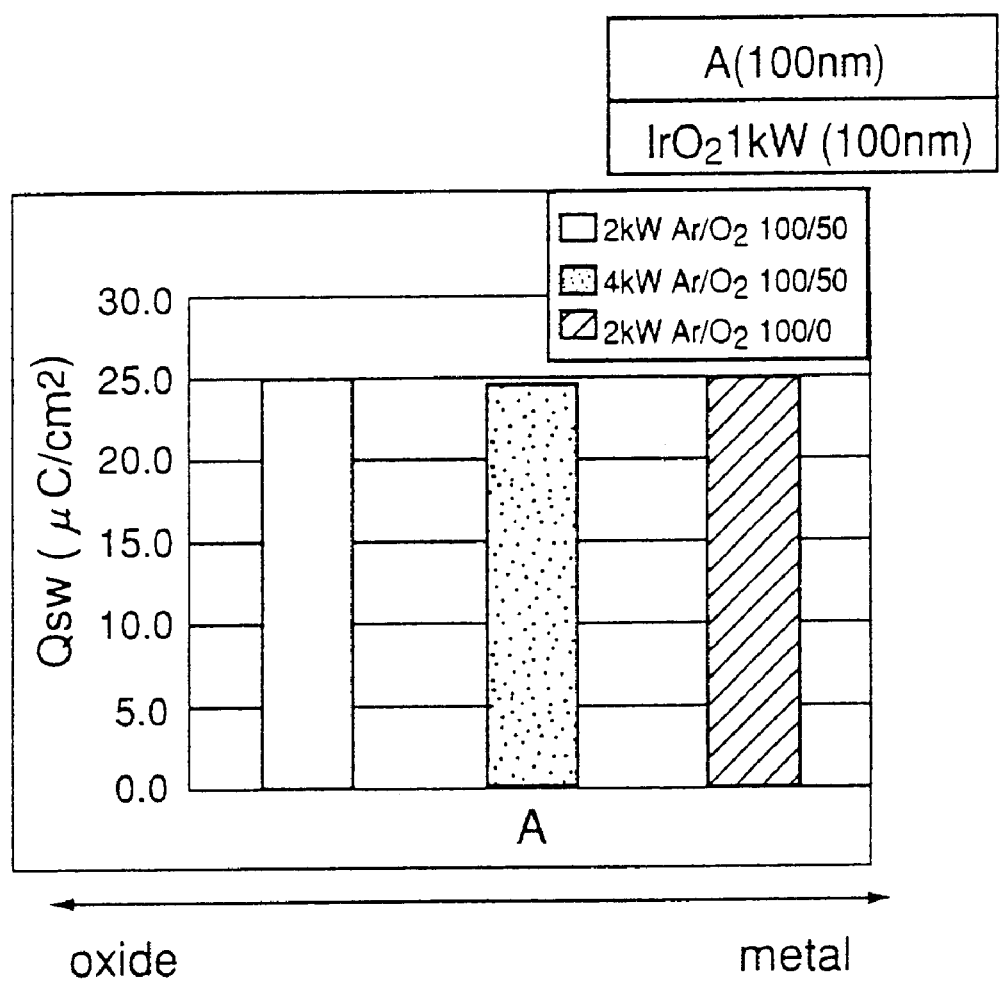
FIG. 10 is a diagram showing the electric property of the ferroelectric capacitor formed according to the process of the present invention.

Meanwhile, the inventor of the present invention has discovered that the switching electric charge $Q_{SW}$ does not change substantially when an $IrO_2$ electrode layer is formed on the ferroelectric film 15 with low sputtering power such as 1 kW, followed by the sputtering process of another $IrO_2$ electrode layer designated "A" as represented in FIG. 10 with an increased sputtering power or with an increased degree of reduction in the sputtering atmosphere.

Referring to FIG. 10, the $IrO_2$ electrode layer 16 is formed first by depositing an initial $IrO_2$ film with a thickness of 100 nm while using the sputtering power of 1 kW, followed by depositing a further $IrO_2$ film with a thickness of 100 nm while using the sputtering power of 2 kW or 4 kW. The deposition condition of the $IrO_2$ films thus constituting the IrO2 electrode layer 16 is summarized in TABLE IV below.

TABLE IV

| $IrO_2$ (two-step process) | |
|---|---|
| pressure | 0.8 Pa |
| oxygen flow-rate | 100 sccm |
| Ar flow-rate | 100 sccm |
| power and time (1$^{st}$ step) | 1 kW, 29 sec |
| power and time (2$^{nd}$ step) | 2 kW, 23 sec |
| substrate temperature | room temperature |
| thickness | 200 nm |

Thus, the present invention provides an efficient way of fabricating a ferroelectric capacitor characterized by an excellent electric property with improved yield, by first carrying out the deposition of the $IrO_2$ electrode layer 16 with a low sputtering power, and then carrying out the deposition with an increased sputtering power while using an oxidizing sputtering atmosphere.

Further, the inventor of the present invention has discovered that the leakage current of $1.50 \times 10^{-4}$ A/cm$^2$ for the ferroelectric capacitor in which the $IrO_2$ electrode layer 16 is formed with the sputtering power of 2 kW, is reduced to $2.0 \times 10^{-5}$ A/cm$^2$ by forming the $IrO_2$ electrode layer 16 with the sputtering power of 1 kW.

Figure 11:
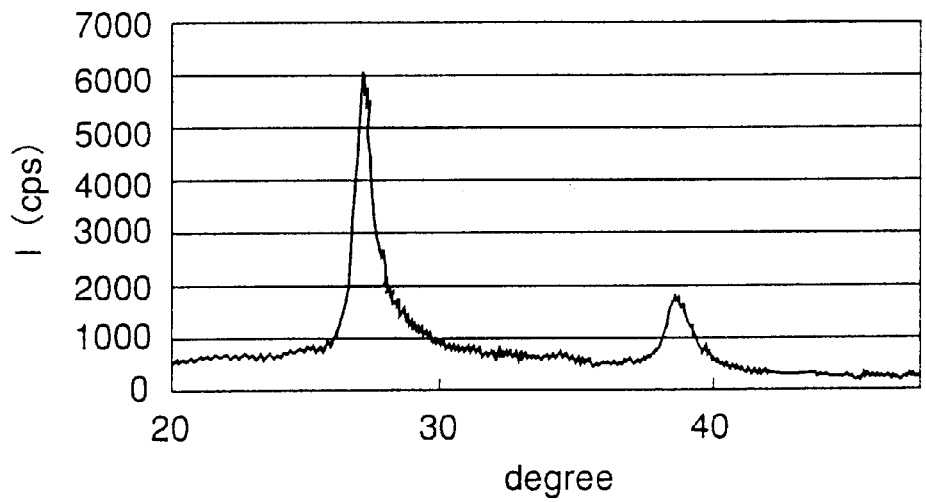
FIG. 11 is a diagram showing the X-ray diffraction pattern of an $IrO_2$ film formed with a sputtering power of 1 kW.

FIG. 11 shows the X-ray diffraction pattern of the $IrO_2$ film obtained by a sputtering process conducted in an atmosphere containing oxygen under the condition of TABLE III while using the sputtering power of 1 kW.

Referring to FIG. 11, it can be seen that there is a distinct diffraction peak corresponding to the (110) surface of $IrO_2$ at the diffraction angle 2θ of about 28°. Further, a diffraction peak corresponding to the (200) surface of $IrO_2$ is observed at the diffraction angle of about 29°.

Figure 12:
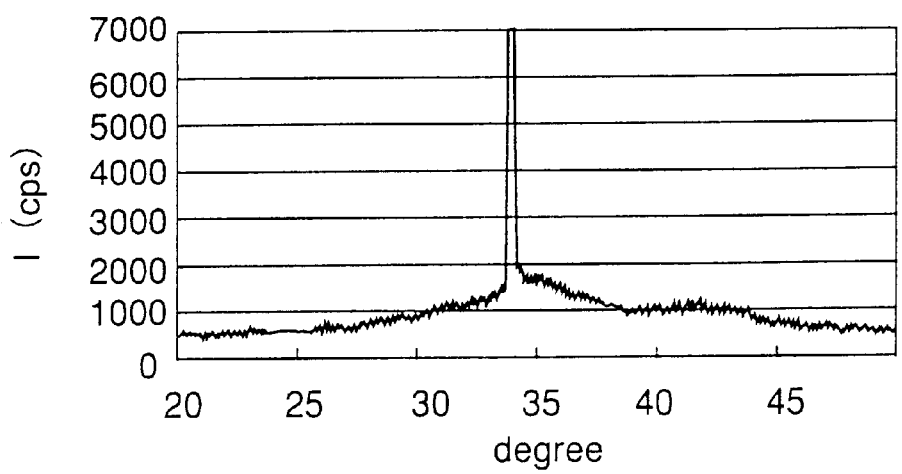
FIG. 12 is a diagram showing the X-ray diffraction pattern of an IrO$_2$ film formed with a sputtering power of 2 kW.

FIG. 12, on the other hand, shows the X-ray diffraction pattern of the $IrO_2$ film deposited by a sputtering process conducted under the sputtering power of 2 kW.

Referring to FIG. 12, the IrO2 film formed according to such a process does not show the reflection of the (110) surface or the (200) surface observed in the case of FIG. 11 but only a strong reflection of Si is observed.

Figure 13:
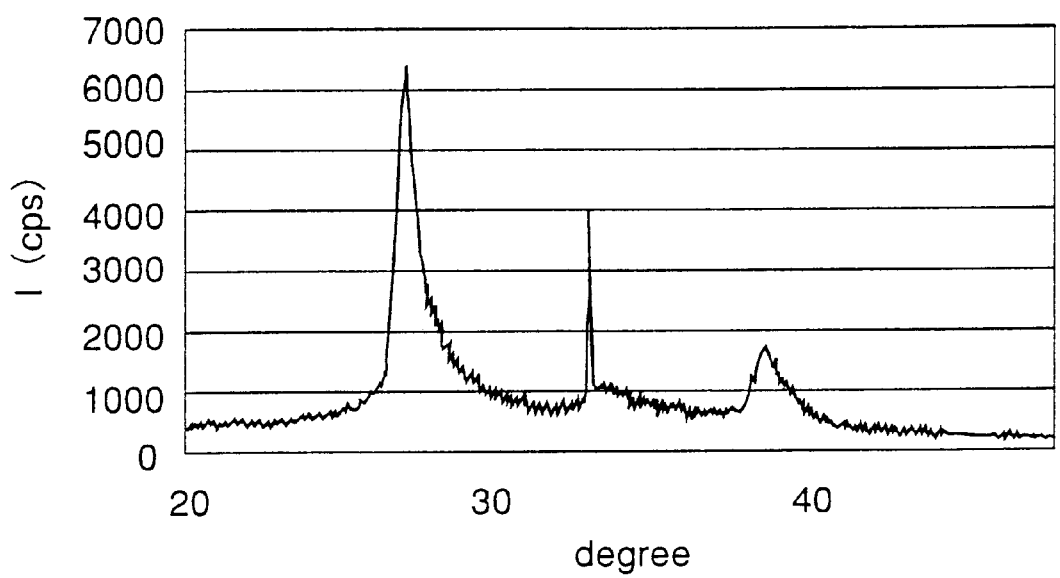
FIG. 13 is a diagram showing the X-ray diffraction pattern of an IrO2 film formed by a two-step process that uses a sputtering power of 1 kW at the beginning and then increasing to 2 kW.

FIG. 13 shows the X-ray diffraction pattern of the $IrO_2$ film formed according to the condition of TABLE IV explained before.

Referring to FIG. 13, it can be seen that the $IrO_2$ film thus formed by the two-step process that uses the low sputtering power at the beginning and then increasing the sputtering power, shows an X-ray diffraction pattern similar to the one shown in FIG. 11 in that there are distinct diffraction peaks corresponding to the (110) surface and the (200) surface of $IrO_2$.

Figure 14A:
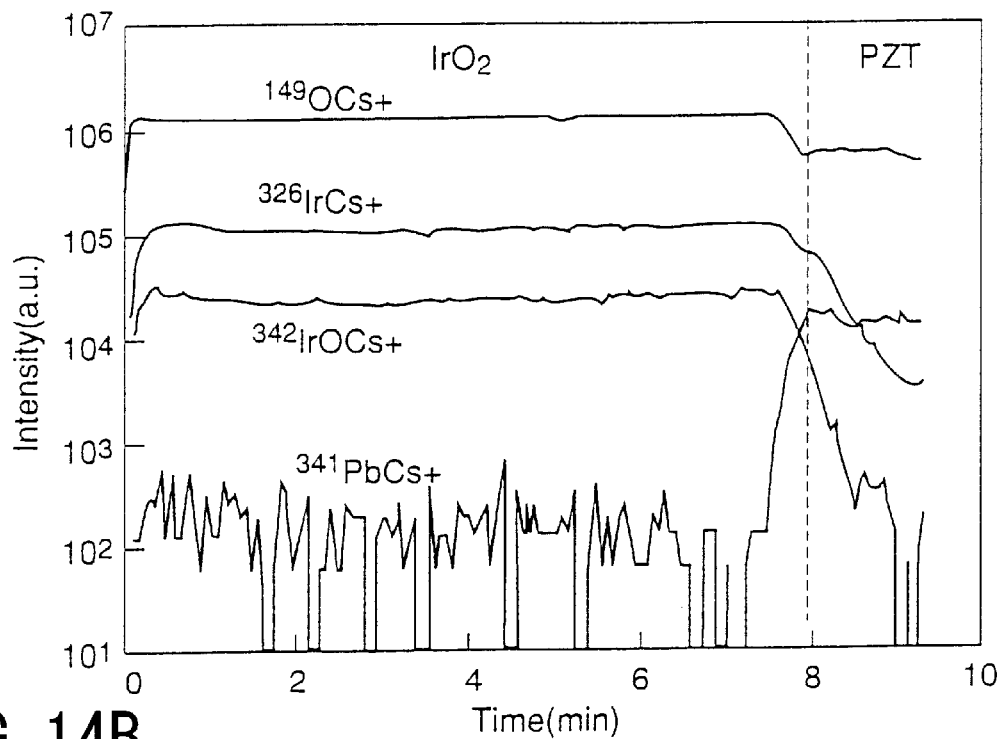
FIGS. 14A–14E are diagrams showing the SIMS profile of various elements in an IrO2 film formed under various sputtering conditions.
Figure 14B:
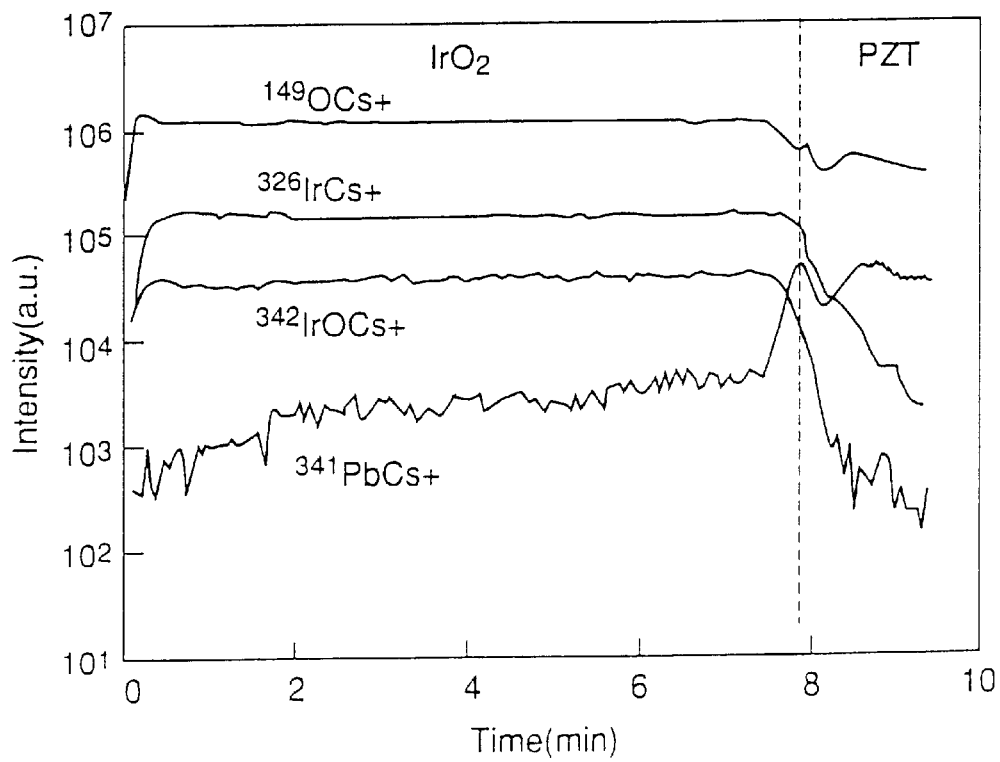

FIGS. 14A–14E show the SIMS profile of various elements in the $IrO_2$ electrode layer 16 thus sputtered under various sputtering conditions, wherein FIG. 14A shows the distribution profile of the elements immediately after the deposition of the IrO$_2$ electrode layer 16 under the condition of TABLE III with the sputtering power of 1 kW, while FIG. 14B shows the distribution profile of the same elements after applying a thermal annealing process to the electrode layer 16.

Referring to FIG. 14A, it can be seen that the Pb concentration level is below the detection threshold in the state immediately after the deposition, while FIG. 14B shows that there occurs a substantial diffusion of Pb from the ferroelectric film 15 into the IrO$_2$ electrode layer 16 when the thermal annealing process is applied at 650° C., and that there is formed a concentration profile of Pb as a result of the thermal annealing process such that the concentration level of Pb decreases gradually from the interface between the ferroelectric film 15 and the IrO$_2$ electrode layer 16 toward the free surface of the layer 16.

Figure 14C:
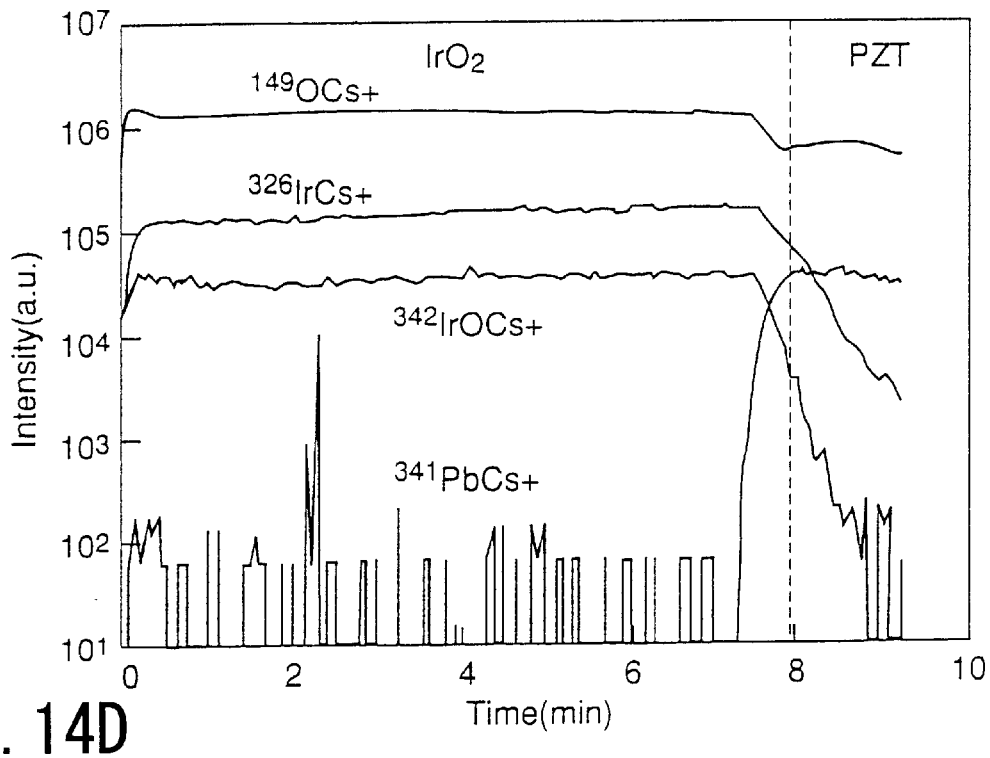
Figure 14D:
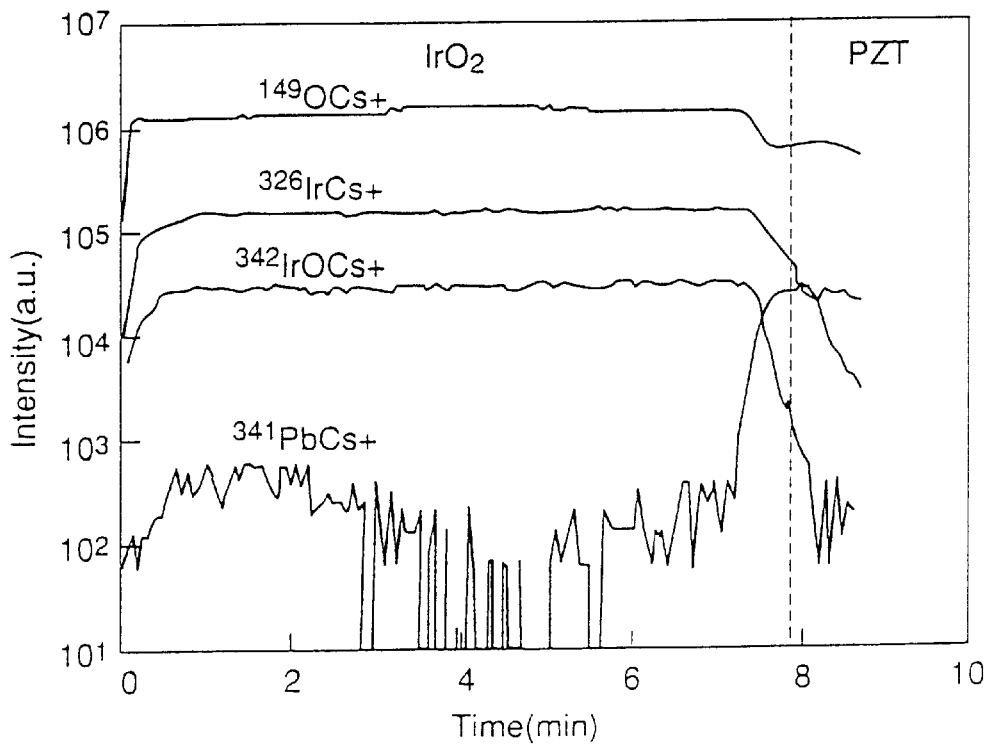

On the other hand, FIG. 14C shows the distribution profile of the elements in the electrode layer 16 immediately after the state in which the electrode layer 16 is formed by a sputtering process conducted with the sputtering power of 2 kW, while FIG. 14D shows the distribution profile of the elements for the case a thermal annealing process is applied to the electrode layer 16 of FIG. 14C.

Referring to FIG. 14C, it can be seen that the electrode layer 16 contains Pb with a concentration level below the detection limit, while there appears a distribution profile of Pb in the electrode layer 16 after the recovery annealing process as represented in FIG. 14D, such that the Pb concentration level is below the detection limit at the intermediate part of the layer 16 while exceeds the detection limit in the vicinity of the free surface of the layer 16 and the interface to the ferroelectric film 15.

Figure 14E:
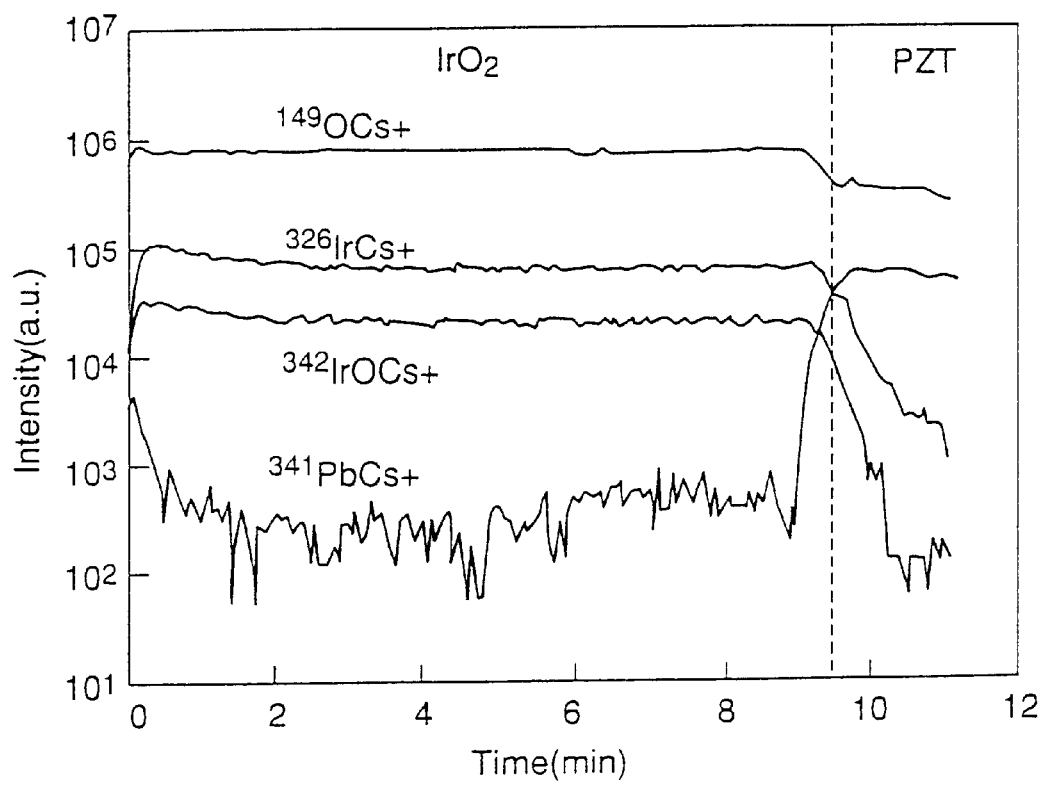

Further, FIG. 14E shows the SIMS profile of the elements in the IrO$_2$ electrode layer 16 for the case the electrode layer 16 is formed under the condition of TABLE IV while using a low sputtering power of 1 kW in the initial period of the sputter deposition process for depositing the IrO$_2$ layer to the thickness of 100 nm and increasing the sputtering power to 2 kW after the initial period for depositing the IrO$_2$ layer for another 100 nm.

Referring to FIG. 14E, it can be seen that the IrO$_2$ electrode layer 16 thus formed contains Pb with a generally uniform concentration level. This profile of Pb is maintained even when a recovery annealing process is applied to the ferroelectric film 15.

It should be noted that the IrO$_2$ electrode layer 16 of FIG. 14E thus formed according to the two-step process is in fact formed of a lower part contacting with the ferroelectric film 15 and an upper part, wherein the lower part, formed under the strong oxidizing condition contains Ir primarily in oxidized state, while the upper part, formed under less strong oxidizing condition, contains a larger proportion of Ir in the metallic state as compared with the lower part.

In the present embodiment, it should be noted that the conductive oxide forming the electrode layer 16 is by no means limited to IrO$_2$ but other conductive oxides such as RhO$_2$ or RuO$_2$, or SrRuO$_3$ may also be used. Further, it is possible to change the sputtering condition gradually in the process of TABLE IV for forming the first layer and the second layer.

[Second Embodiment]

Figure 15A:
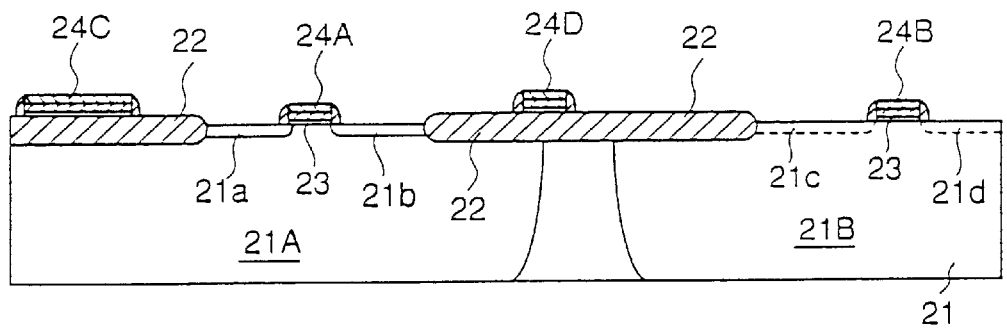
FIGS. 15A–15R are diagrams showing the fabrication process of a ferroelectric random access memory according to a second embodiment of the present invention.
Figure 15B:
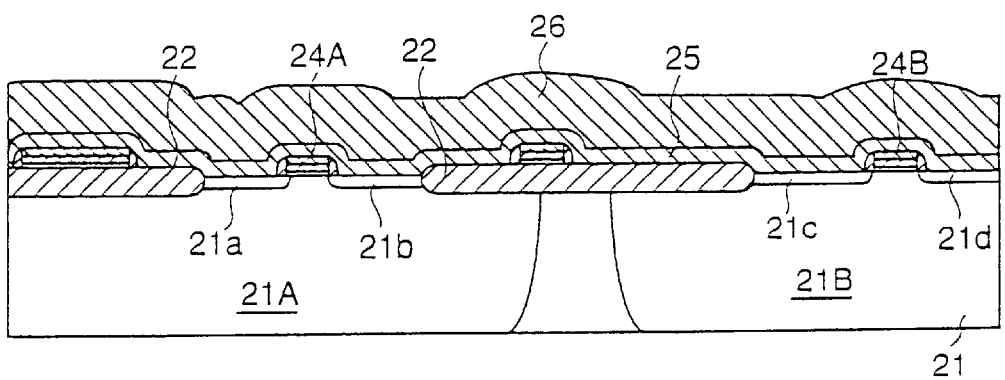
Figure 15C:
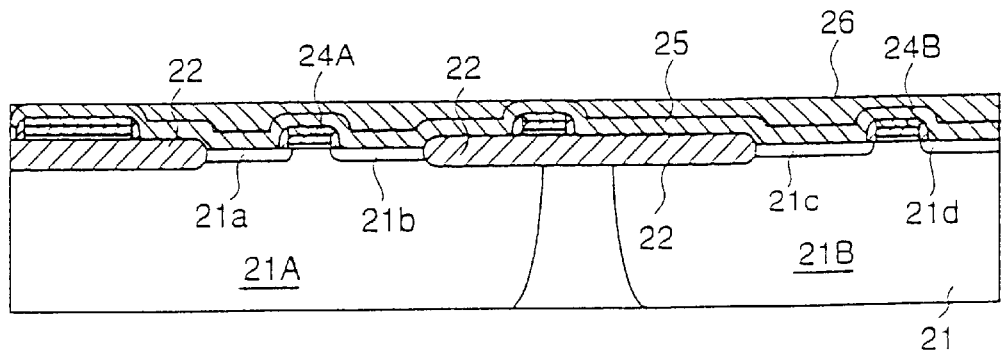
Figure 15D:
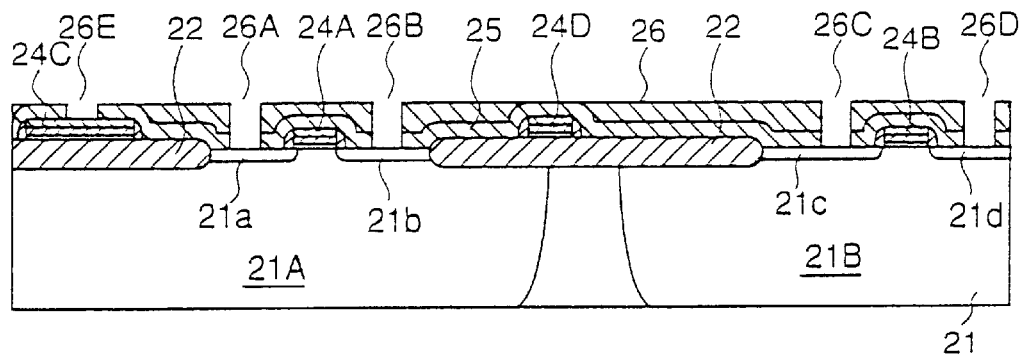
Figure 15E:
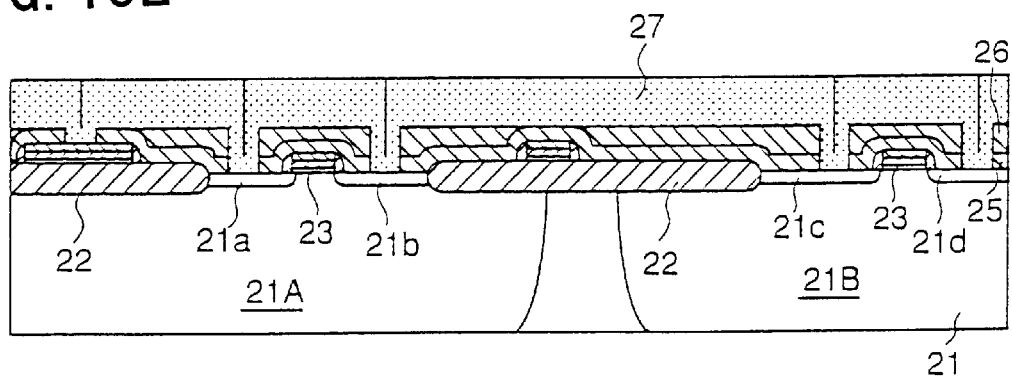
Figure 15F:
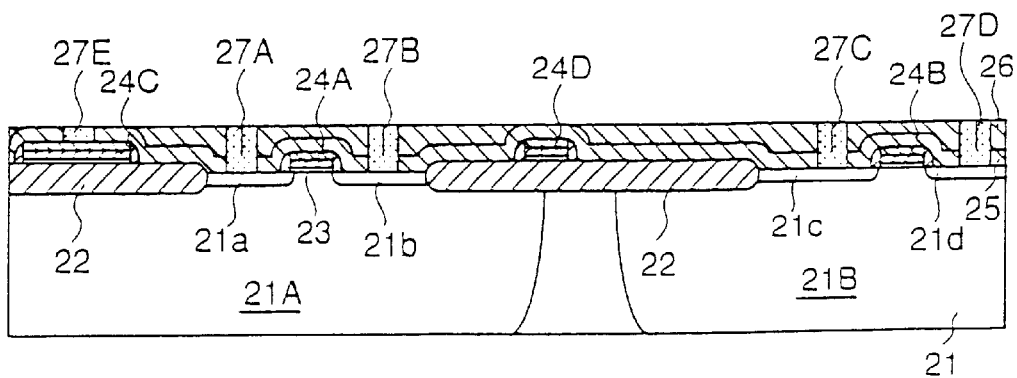
Figure 15G:
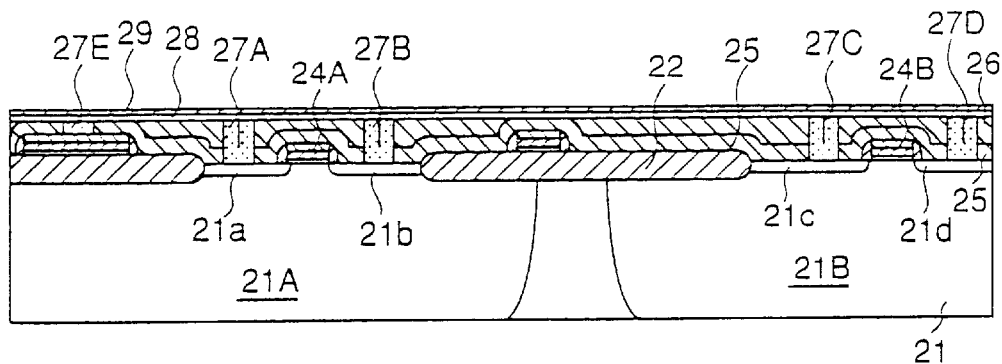
Figure 15H:
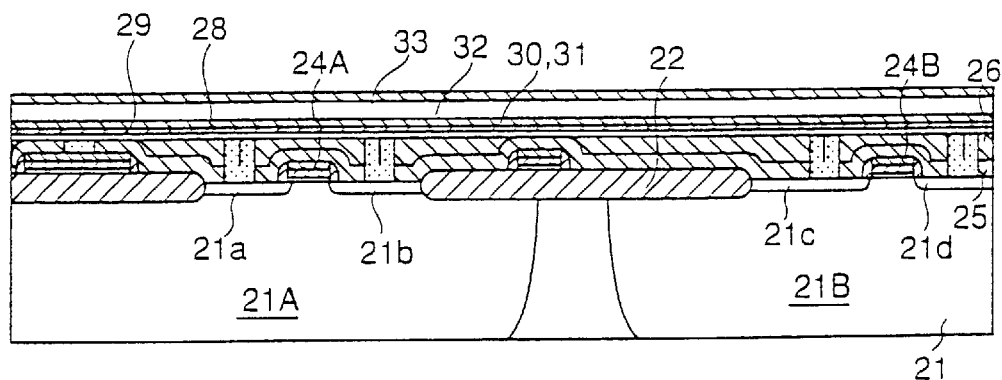
Figure 15I:
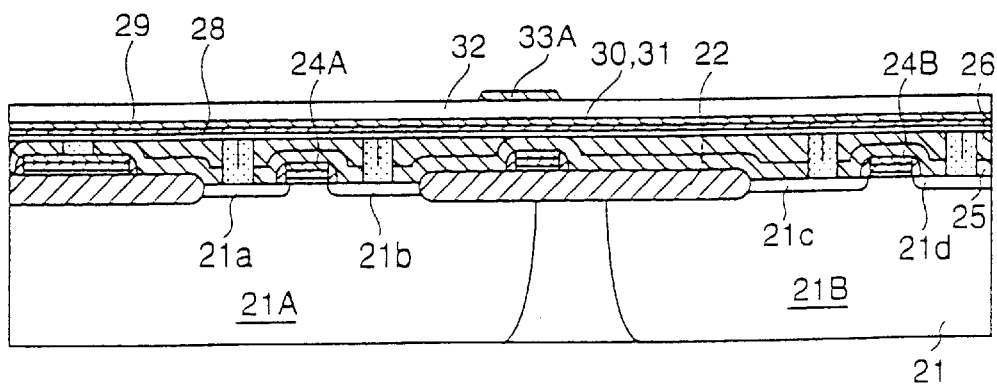
Figure 15J:
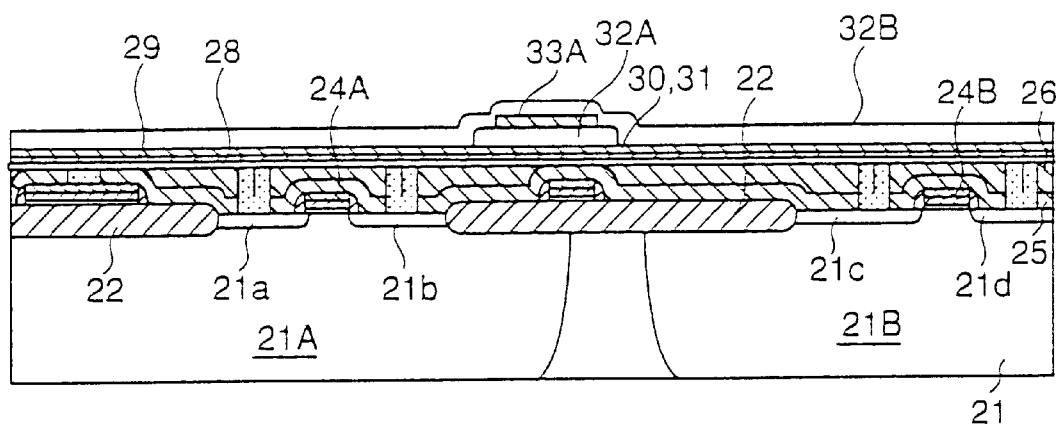
Figure 15K:
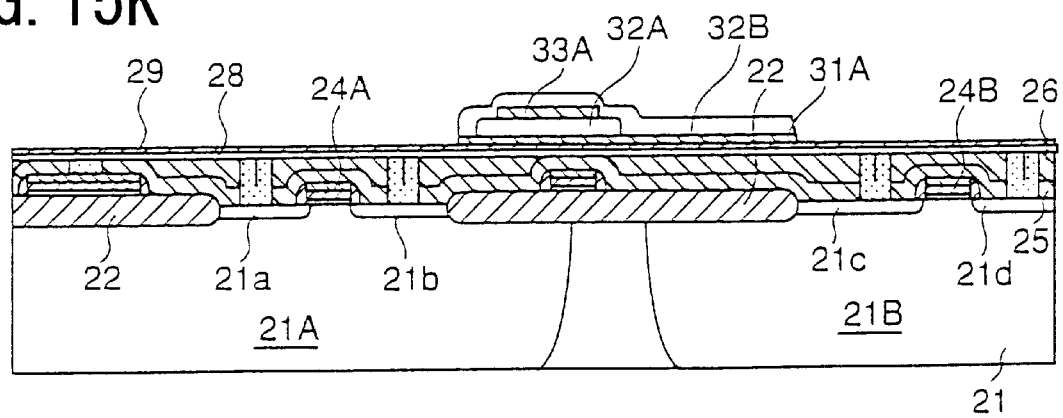
Figure 15L:
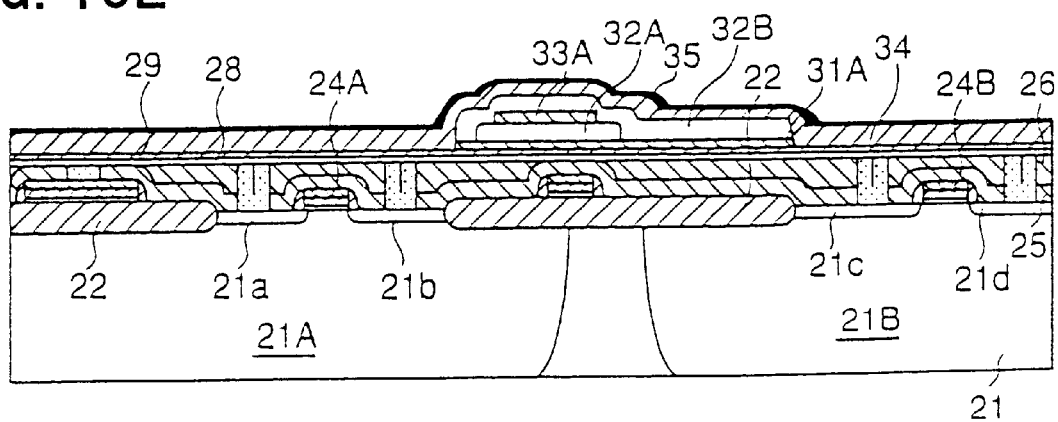
Figure 15M:
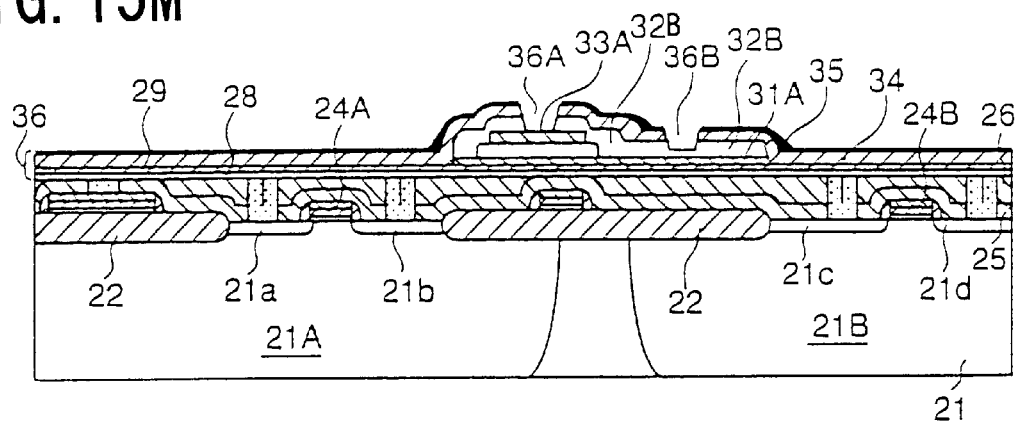
Figure 15N:
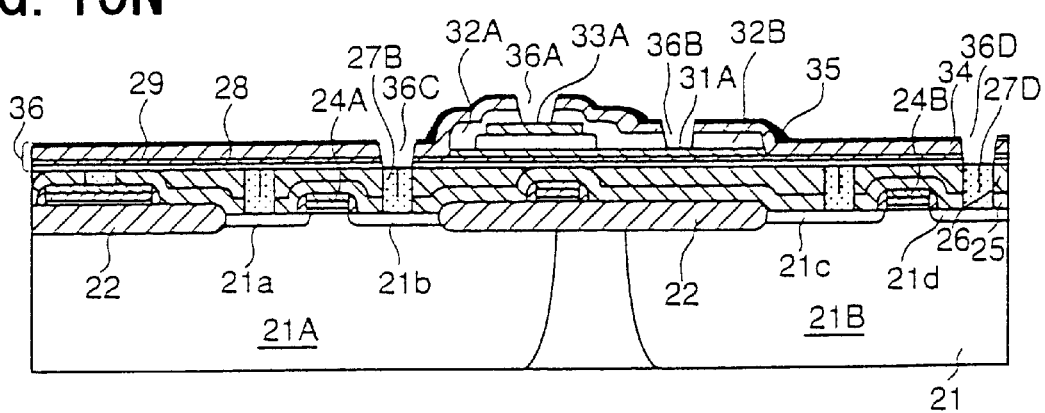
Figure 15O:
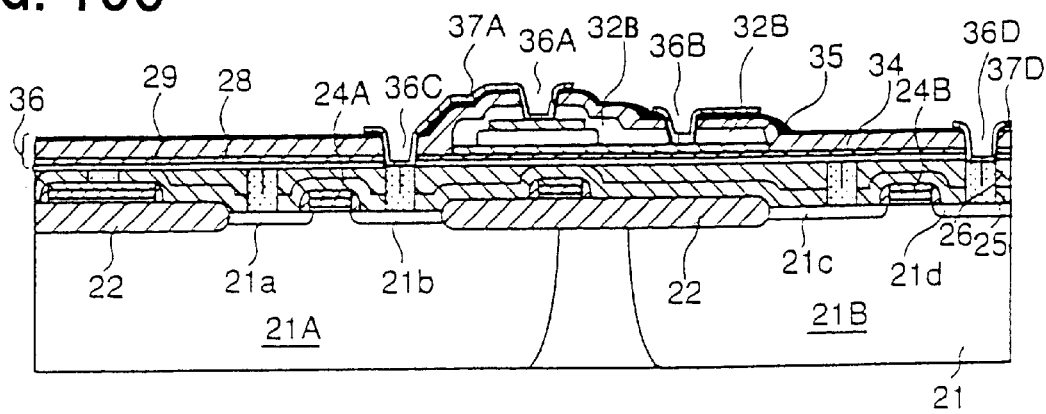
Figure 15P:
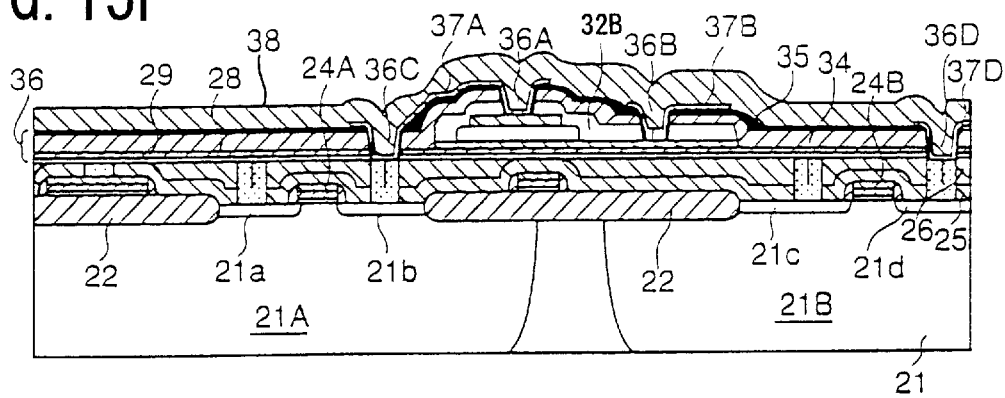
Figure 15Q:
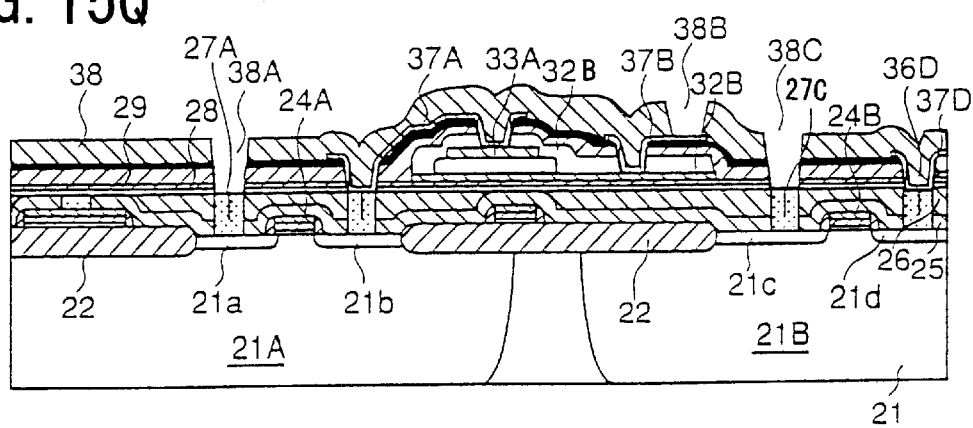
Figure 15R:
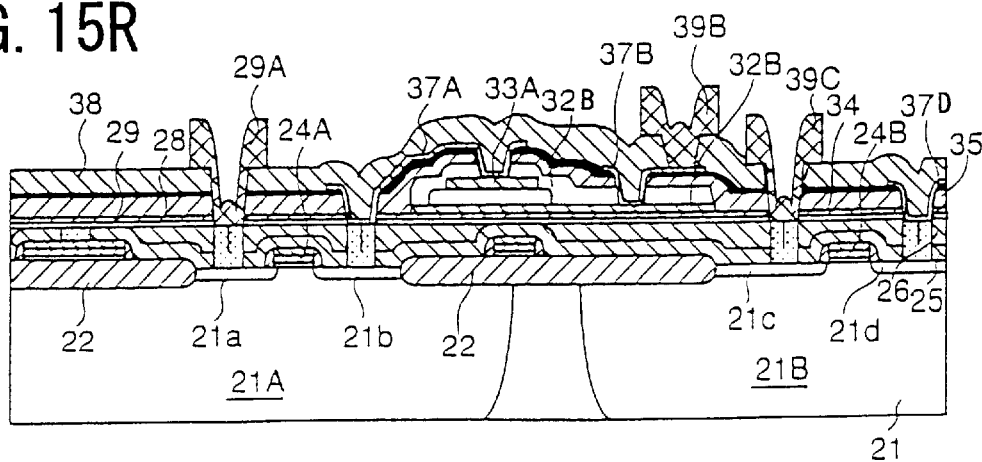

FIGS. 15A–15R show the fabrication process of a semiconductor device according to a second embodiment of the present invention.

Referring to FIG. 15A, a p-type well 21A and an n-type well 21B are formed on a Si substrate 21, which may be any of the p-type or n-type, wherein the Si substrate 21 is covered by a field oxide film 22 defining an active region in each of the p-type well 21A and the n-type well 21B.

Next, a gate oxide film 23 is formed on the active region of the p-type well 21A and also on the active region of the n-type well 21B, and a p-type polysilicon gate electrode 24A is formed on the gate oxide film 23 in the p-type well 21A. Similarly, an n-type polysilicon gate electrode 24B is formed on the gate oxide film 23 in correspondence to the n-type well 21B. In the illustrated example, polysilicon interconnection patterns 24C and 24D are formed further on the field oxide film 22 similarly to the polysilicon gate electrodes 24A and 24B.

In the structure of FIG. 15A, there are formed n-type diffusion regions 21a and 21b in the active region of the p-type well 21A by introducing an n-type impurity element by an ion implantation process, while using the gate electrode 24A and the side wall insulation films thereon as a self-alignment mask. Similarly, p-type diffusion regions 21c and 21d are formed in the active region of the n-type well 21B by an ion implantation process of a p-type impurity element, while using the gate electrode 24B and the side wall insulation films thereon as a self-alignment mask.

The process so far is nothing but an ordinary CMOS process.

Next, in the step of FIG. 15B, an SiON film 25 is deposited on the structure of FIG. 15A by a CVD process with a thickness of about 200 nm, and an SiO$_2$ film 26 is further deposited on the SiON film 25 by a CVD process with a thickness of about 1000 nm.

Further, in the step of FIG. 15C, the SiO$_2$ film 26 is subjected to a CMP process while using the SiON film 25 as a polishing stopper, and contact holes 26A–26D are formed in the step of FIG. 15D in the SiO$_2$ film 26 thus planarized such that the diffusion regions 21a, 21b, 21c and 21d are exposed by the contact holes 26A, 26B, 26C and 26D. In the illustrated example, the SiO$_2$ film 26 is further formed with a contact hole 26E so as to expose the interconnection pattern 24C.

Next, in the step of FIG. 15E, a W layer 27 is deposited on the structure of FIG. 15D so as to fill the contact holes 26A–26E, wherein the W layer 27 thus deposited is subjected to a CMP process in the step of FIG. 15F while using the SiO$_2$ film 26 as a stopper. As a result of the polishing process, there are formed W plugs 27A–27E respectively in correspondence to the contact holes 26A–26E as represented in FIG. 15F.

Next, in the step of FIG. 15G, an oxidization stopper film 28 of SiN and an SiO$_2$ film 29 are deposited consecutively on the structure of FIG. 15F respectively with the thicknesses of 100 nm and 130 nm, followed by a thermal annealing process conducted in an N$_2$ atmosphere at 650° C. for about 30 minutes. The thermal annealing process is conducted so as to thoroughly remove gases from the structure thus formed.

Next, in the step of FIG. 15H, a Ti film 30 and a Pt film 31 are deposited consecutively on the SiO$_2$ film 29 with respective thicknesses of 20 nm and 175 nm by a sputtering process, which may be conducted according to the condition represented in TABLE I. The Ti film 30 and the Pt film 31 thereon constitute a lower electrode layer of the ferroelectric capacitor to be formed.

After the deposition of the Ti film 30 and the Pt film 31, a ferroelectric film 32 of PZT or PLZT is sputter-deposited in the step of FIG. 15H under the condition of TABLE II, wherein the ferroelectric film 32 may contain Ca or Sr.

Further, in the step of FIG. 15H, the ferroelectric film 32 is subjected to a crystallization process by an RTA process conducted in an oxidizing atmosphere at the temperature of 750° C. for 20 seconds. During the RTA process, any oxygen defects formed in the ferroelectric film 32 is compensated for. By using a large rate of temperature increase of 125° C./sec, the duration of the thermal annealing process is minimized.

Further, in the step of FIG. 15H, an $IrO_2$ film 33 is deposited on the ferroelectric film 32 thus processed as an upper electrode layer with a thickness of about 200 nm by a sputtering process conducted according to the condition of TABLE IV.

Next, in the step of FIG. 15I, a resist pattern is formed on the upper electrode layer 33, followed by the patterning of the upper electrode layer 33 by a dry etching process to form an upper electrode pattern 33A of $IrO_2$ on the ferroelectric film 32. In the step of FIG. 15I, it should further be noted that the ferroelectric film 32 is subjected, after the foregoing sputtering and patterning of the upper electrode pattern 33A, to a recovery annealing process conducted in an $O_2$ atmosphere at 650° C. for 60 minutes or so as to recover any damages caused in the ferroelectric film 32 as a result of the foregoing sputtering and patterning processes.

Next, in the step of FIG. 15J, a resist pattern having a shape corresponding to the shape of the capacitor insulation film-to be formed, is formed on the ferroelectric insulation film 32, and the ferroelectric insulation film 32 is subjected to a dry etching process while using the foregoing resist pattern as a mask. As a result, a desired ferroelectric capacitor insulation film pattern 32A is formed on the underlying lower electrode layer 31. Further, an encapsulating layer 32B is formed on the lower electrode layer 31 by a ferroelectric material having a composition substantially identical with that of the material constituting the ferroelectric film 32, by conducting a sputtering process with a thickness of about 20 nm. The encapsulating layer 32B thus deposited is then annealed by an RTA process in the $O_2$ atmosphere at 700° C. for 60 seconds with a temperature profile of about 125° C./min. The encapsulating layer 32B thereby protects the ferroelectric capacitor insulation film pattern 32A from reduction.

Next, in the step of FIG. 15K, a resist pattern is formed on the lower electrode layer 31 so as to cover the encapsulating layer 32B with a pattern corresponding to the lower electrode pattern to be formed. Further, by conducting a dry etching process on the foregoing encapsulating layer 32B and the underlying Pt and Ti films 30 and 31 underneath the encapsulating layer 32B by a dry etching process, a lower electrode pattern 31A is formed.

After the formation of the lower electrode pattern 31A, the resist pattern is removed in the step of FIG. 15K, and the damages that are introduced into the ferroelectric capacitor insulation film 32A during the dry etching process of the lower electrode pattern 31A are recovered by conducting a recovery annealing process in an $O_2$ atmosphere at 650° C. for 60 minutes.

Next, in the step of FIG. 15L, an $SiO_2$ film 34 is deposited on the structure of FIG. 15K by a CVD process, typically with a thickness of about 200 nm, followed by a formation of an SOG film 35 thereon, wherein the SOG film 35 smoothes any sharp steps formed on the underlying $SiO_2$ film 34. The $SiO_2$ film 34 and the SOG film 35 form together an interlayer insulation film 36.

Next, in the step of FIG. 15M, contact holes 36A and 36B are formed in the interlayer insulation film 36 so as to expose the upper electrode pattern 33A and the lower electrode pattern 31A respectively, and contact holes 36C and 36D are formed further in the step of FIG. 15N in the interlayer insulation film 36 so as to expose the W plugs 27B and 27D respectively through the underlying $SiO_2$ film 29 and the SiN film 28. Further, in the step of FIG. 15M, a recovery annealing process is conducted, after the dry etching process for forming the contact holes 36A and 36B, in an $O_2$ atmosphere at 550° C. for 60 minutes. As a result of the recovery annealing process, any damages introduced into the ferroelectric film patterns 32A and 32B during the dry etching process are eliminated.

Next, in the step of FIG. 15O, a local interconnection pattern 37A is formed by a TiN film such that the local interconnection pattern 37A connects the contact hole 36A and the contact hole 36C electrically. Further, a similar local interconnection pattern 37B and 37C are formed on the contact holes 36B and 36C.

Next, in the step of FIG. 15P, an $SiO_2$ film 38 is formed on the structure of FIG. 15O, and contact holes 38A, 38B and 38C are formed in the $SiO_2$ film 38 in the step of FIG. 15Q so as to expose the W plug 27A, the local interconnection pattern 37B and the W plug 27C, respectively.

Further, in the step of FIG. 15R, electrodes 39A, 39B and 39C are formed respectively in correspondence to the contact holes 38A, 38B and 38C.

Further, the process of forming the interlayer insulation film and the interconnection patterns may be repeated as desired, to form a multilayer interconnection structure.

According to the present embodiment, the problem of defect formation in the upper electrode 33A is successfully eliminated while maintaining a practical deposition rate when forming the $IrO_2$ film 33, by conducting the sputtering process in two steps, first with a lower sputtering power and then with an increased sputtering power. Further, such a two-step sputtering process of the $IrO_2$ layer 33 successfully prevents deterioration of the electric properties of the ferroelectric capacitor insulation film 32A.

Further, the present invention is not limited to the embodiments described heretofore, but various variations and modifications may be made without departing from the scope of the present invention.

I claim:

1. A ferroelectric capacitor, comprising:

a lower electrode;

a ferroelectric film containing Pb formed on said lower electrode; and an upper electrode provided on said ferroelectric film, said upper electrode comprising a conductive oxide film of a metal deposited on said ferroelectric film, said conductive oxide film containing Pb with a generally uniform concentration in a thickness direction thereof, said conductive oxide film comprising a lower part and an upper part, said upper part containing more proportion of said metal in a metallic state as compared with said lower part.

2. A ferroelectric capacitor as claimed in claim 1, wherein said conductive oxide film comprises a compound selected from the group consisting of $IrO_2$, $RhO_2$, $RuO_2$ and $SrRuO_3$.

3. A ferroelectric capacitor as claimed in claim 2, wherein said conductive oxide film is formed of crystals of said compound having a generally uniform grain size, with an average grain size of 10–30 nm.

4. A ferroelectric capacitor as claimed in claim 1, wherein said ferroelectric film has a perovskite crystal structure.

5. A ferroelectric capacitor as claimed in claim 1, wherein said ferroelectric film comprises a zirconate titanate of Pb.

6. A semiconductor device, comprising:

a substrate, an active device formed on said substrate, an interlayer insulation film provided on said substrate so as to cover said active device; and a ferroelectric capacitor provided on said interlayer insulation film in electrical connection with said active device, said ferroelectric capacitor comprising: a lower electrode formed on said interlayer insulation film, a ferroelectric film containing Pb formed on said lower electrode; and an upper electrode formed on said ferroelectric film, said upper electrode comprising a conductive oxide film deposited on said ferroelectric film, said conductive oxide film containing Pb with a generally uniform concentration in a thickness direction thereof, said conductive oxide film comprising a lower part and an upper part, said upper part containing more proportion of said metal in a metallic state as compared with said lower part.

7. A semiconductor device as claimed in claim 6, wherein said conductive oxide film comprises a compound selected from the group consisting of $IrO_2$, $RhO_2$, $RuO_2$ and $SrRuO_3$.

8. A semiconductor device as claimed in claim 7, wherein said conductive oxide film is formed of crystals of said compound having a generally uniform grain size, with an average grain size of 10–30 nm.

9. A ferroelectric capacitor as claimed in claim 6, wherein said ferroelectric film has a perovskite crystal structure.

10. A ferroelectric capacitor as claimed in claim 6, wherein said ferroelectric film comprises a zirconate titanate of Pb.

* * * * *